Sept. 22, 1964 AKIHIKO SATO 3,150,021

METHOD OF MANUFACTURING SEMICONDUCTOR DEVICES

Filed July 25, 1961

INVENTOR.
AKIHIKO SATO
BY Roy C. Hopgood
ATTORNEY

United States Patent Office 3,150,021

Patented Sept. 22, 1964

3,150,021

METHOD OF MANUFACTURING SEMICONDUCTOR DEVICES

Akihiko Sato, Tokyo, Japan, assignor to Nippon Electric Company Limited, Tokyo, Japan, a corporation of Japan Filed July 25, 1961, Ser. No. 126,625

9 Claims. (Cl. 156—17)

This invention relates in general to a method of manufacturing semiconductor devices and in particular to a method of controlling the maximum and minimum current values in tunnel diodes, PNPN or NPNP junction transistors, unijunction transistors, and other semiconductor devices which have maximum current points or minimum current points or both in their characteristic curves.

When semiconductor devices of the above noted type are manufactured, it is necessary to adjust the characteristic maximum and minimum current values to a predetermined level and to maintain these current values within a close tolerance under mass production conditions. This is required because maximum current and minimum current are important circuit parameters, whereby a circuit that will operate well at one level of maximum or minimum current might operate poorly at a different level of maximum or minimum current and in many cases the circuit might be totally inoperable at the wrong current level. For this reason, circuit designers become very unhappy when they order a transistor which is supposed to have a certain maximum or minimum current value and then receive a transistor which has a different maximum or minimum current value. Therefore it is necessary for transistor manufacturers to control the maximum or minimum current values of their products to stay within a close tolerance of the predetermined characteristic current values which are published in their transistor specification sheets and advertising literature. Furthermore, since competition is quite keen in the transistor field, it is highly desirable to have a simple, quick, inexpensive, highly accurate method which is compatible with mass production techniques.

Accordingly, one object of this invention is to provide a method of controlling the characteristic maximum and minimum current values of semiconductor devices.

Another object of this invention is to provide a simple, quick, inexpensive, highly accurate method of controlling the characteristic maximum and minimum current values of semiconductor devices.

A further object of this invention is to provide a method of the above noted type which is compatible with mass production techniques.

An additional object of this invention is to provide apparatus adapted to be used in connection with the above noted method.

Other objects and advantages of this invention will be apparent from the following description of several specific embodiments thereof, as illustrated in the attached drawings, in which.

Although the method of this invention is applicable to many semiconductor devices, it is particularly useful in the manufacture of tunnel diodes and it will therefore be described in connection with tunnel diodes. It should be understood, however, that the following description is offered by way of example and that the method of this invention is by no means limited to the specific application disclosed herein.

Figure 1:
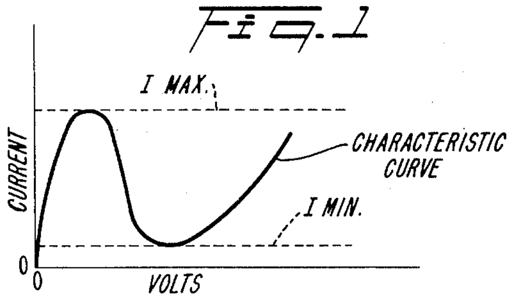
FIG. 1 is a characteristic curve of one illustrative semiconductor device having a maximum current value and a minimum current value.

FIG. 1 shows the characteristic curve of a tunnel diode, which is designed to contain a first positive resistance region (0 to $I_{max}$), a negative resistance region ($I_{max}$ to $I_{min}$) and a second positive resistance region ($I_{min}$ to $I_{max}$) arranged in sequence. Since the tunnel diode is adapted to switch very swiftly from one point on its characteristic curve to a different point thereon, it has found wide and increasingly important applications in high speed digital computers and other circuits which require very high speed switching. The tunnel diode, however, cannot operate as a switch in itself; it must be coupled together with other circuit elements so that the combined circuit forms a switch. Therefore it is particularly important to maintain a close tolerance on the characteristic maximum and minimum current values of each type of tunnel diode so that the diodes will work well in circuits which are designed in accordance with the maximum and minimum current values published in the transistor manufacturer's specification sheets and manufacturing literature. It is disconcerting, to say the least, for a circuit engineer to design a switch circuit to fit the nominal characteristics of one type of tunnel diode and then discover that his circuit will not work because the actual characteristics of his tunnel diodes differ from their nominal characteristics.

In accordance with the novel method of this invention, the maximum and minimum current values are held within a close tolerance by varying the P–N junction area of the tunnel diode and measuring its characteristic maximum and minimum current values in terms of the capacitance across the junction area. The maximum current level and the capacitance across the junction are both directly proportional to the junction area, and it is therefore possible to determine a particular capacitance value which corresponds to the desired maximum current level in any specific type of tunnel diode. The desired characteristics can then be achieved by simply manufacturing the tunnel diodes with slightly oversize junction areas, in a physical arrangement which exposes the periphery of the junction area, and etching away the edges of the junction area in a chemical etching fluid while simultaneously measuring the capacitance across the junction. When the capacitance has dropped to the desired level, the diode is quickly withdrawn from the etching fluid, washed clean with distilled water or the like and then encapsulated in accordance with well known prior art techniques to form the finished product. With tunnel diodes it is only necessary to control the maximum current value, because the ratio between maximum current and minimum current is independent of junction area. This ratio is determined by other parameters, such as the concentration of impurities adjacent to the junction, and the minimum current will therefore be automatically adjusted to its desired level when the maximum current is adjusted to its desired level.

Figures 2, 3:
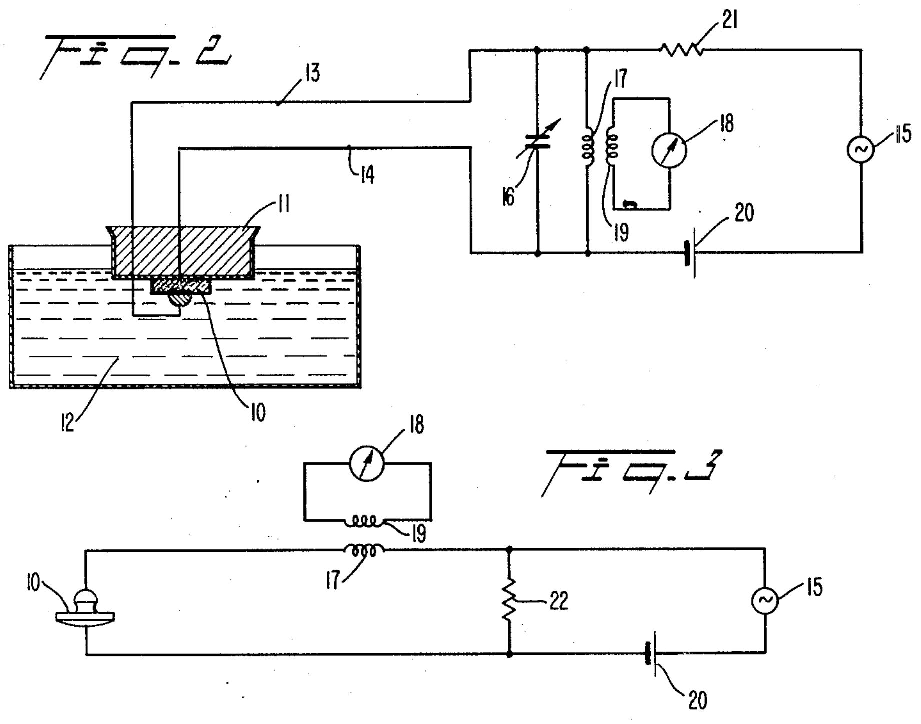
FIG. 2 is a schematic diagram showing one step in the method of this invention and one illustrative measuring circuit which can be used in connection with the method of this invention.
FIG. 3 is a schematic diagram showing a second measuring circuit which can be used in connection with the method of this invention.

FIG. 2 shows the etching step in the method of this invention and some illustrative apparatus which can be used in connection with the method of this invention. A tunnel diode 10 is secured to the underside of a jig member 11 which floats on the surface of a chemical etching fluid 12. The etching fluid 12 may be for example, a 5–10% aqueous solution of sodium or potassium hydroxide or other suitable etchant, and the diode 10 may be a semiconductor material such as for example, germanium. Tunnel diode 10 can be of any suitable type or physical configuration provided that its junction area will be progressively reduced in area by the etching action of fluid 12. If desired, portions of tunnel diode 10 can be covered by some corrosion resistant material such as plastic, wax, or the like so that only selected portions are eaten away in the etching process. In general, however, such coverings will be neither necessary nor desirable because they add to the labor involved in the process. Jig member 11 can be made of any suitable material which is immune to the effects of etching fluid 12, and it is preferably adapted so that tunnel diode 10 can be quickly mounted on and detached from its lower surface. This, of course, can be done in accordance with any suitable prior art techniques. Jig member 11 is fitted with conductors 13 and 14 which are adapted to be coupled to respective terminals of tunnel diode 10.

The terminals of tunnel diode 10 are coupled through conductors 13 and 14 to a capacitance measuring circuit comprising an oscillator 15, a tuned circuit containing a variable capacitor 16 and a fixed inductance 17, and a current meter 18 which is coupled to inductance 17 through a pick up coil 19. It will be apparent to those skilled in the art that the resonant frequency of the tuned circuit will be determined in part by the setting of variable capacitance 16 and in part by the capacitance between the terminals of the tunnel diode. Therefore, with the proper frequency setting of oscillator 15 and the proper capacitance setting of variable capacitor 16 the current meter 18 will reach a maximum when the capacitance across tunnel diode 10 reaches a predetermined value. The exact relationship between these quantities is expressed by the equation $$f=\frac{1}{2\pi\sqrt{L(C_v+C_t)}}$$

where $f$=the resonant frequency of the tuned circuit, $L$=the inductance in the tuned circuit, $C_v$=the capacitance of variable capacitor 16, and $C_t$=the capacitance across tunnel diode 10. The exact values for these variables will, of course, depend on the specific type of diodes to be produced, but the exact values can be determined by well known prior art techniques for any specific situation.

The capacitance measuring circuit preferably contains a bias voltage source 20 and current limiting resistor 21 coupled in series between oscillator 15 and tunnel diode 10. Voltage source 20 and resistor 21 are selected to bias tunnel diode 10 to operate in the negative resistance region so as to reduce current flow in the circuit during the measurement process and to avoid swamping the tuned circuit. Although conduction through the tunnel diode is increased by etching fluid 12, this increase is substantially cancelled by the negative conductance which the diode presents in the negative resistance region, compensated for by the bias voltage, and a high value of Q can therefore be realized in the tuned circuit. This produces a sharp and definite indication of resonance in the tuned circuit.

With the above described apparatus the method of this invention is reduced to the steps of (A) placing the diode in the jig member, (B) placing the jig member in the etching fluid, (C) withdrawing the jig member from the etching fluid when meter 18 reaches its maximum reading, (D) cleaning the diode with distilled water or some other cleaning agent, and (E) removing the diode from the jig member.

FIG. 3 shows another capacitance measuring circuit which is similar to the circuit of FIG. 1 but which uses a series resonant circuit instead of a parallel resonant circuit. In FIG. 2 inductance 17 is coupled in series with oscillator 15 and the capacitance between the terminals of tunnel diode 10. Current limiting resistor 21 is replaced by a shunt resistor 22, which serves the same function. The operation of this circuit will be apparent to those skilled in the art.

Figure 4:
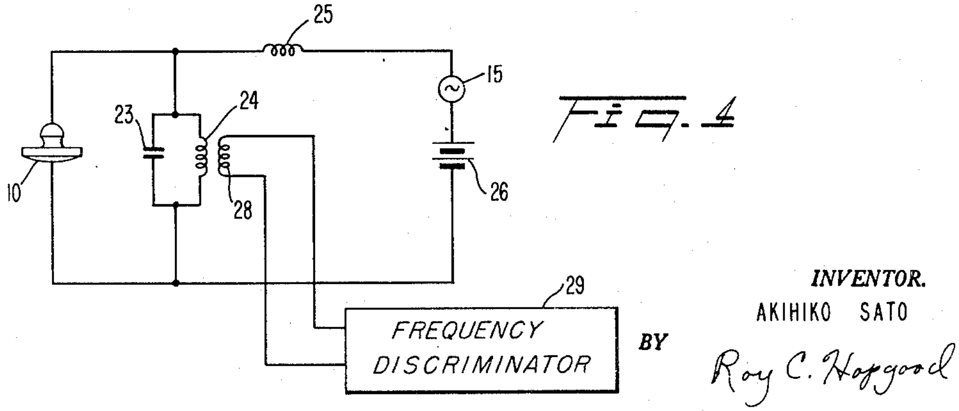
FIG. 4 is a schematic diagram showing a third measuring circuit which can be used in connection with the method of this invention.

FIG. 4 shows a third capacitance measuring circuit. In the circuit tunnel diode 10 is connected as the active component in an oscillator circuit containing a parallel tuned circuit (capacitor 23 and inductance 24), a load inductance 25, and a battery 26. In this oscillator circuit the output frequency, which varies in accordance with the capacitance of the tunnel diode, is detected by a pick up coil 28 which is coupled to a frequency discriminator 29. When the capacitance of the tunnel diode reaches its desired value this will be indicated by an output from the frequency discriminator, which is preferably sharply tuned to the frequency corresponding to the desired capacitance value. The output of the frequency discriminator can be coupled to an aural or visual indicating device or both. For example, a buzzer and a red light might be coupled to frequency discriminator 11 to indicate when the diode has reached its desired capacitance value.

From the foregoing description it will be apparent that this invention provides a simple, quick, inexpensive, highly accurate method of controlling the characteristic maximum and minimum current values of semiconductor devices. And it should be understood that this invention is by no means limited to the specific examples disclosed herein. Many modifications can be made in the examples without departing from the basic teaching of this invention, which includes all modifications falling within the scope of the following claims.

I claim:

1. In the method of manufacturing a semiconductor device having a controllable current characteristic, the steps comprising (A) forming a P-N junction in a semiconductor material, said junction having a peripheral portion thereof exposed on an outer surface of said semiconductor material whereby the area of said junction can be reduced by etching away said outer surface of said semiconductor material, (B) coupling a capacitance measuring device including a timed circuit and resonance indicator across said junction to measure the capacitance thereacross, (C) placing said outer surface of said semiconductor material in contact with an etching fluid to progressively etch away said outer surface of said semiconductor material to thereby change the junction capacitance and (D) removing said semiconductor material from said etching fluid when said resonance indicator indicates that said tuned circuit is at resonance, said resonance condition being indicative of a predetermined current characteristic of said device.

2. In the method of manufacturing semiconductor devices, the steps comprising (A) forming a P-N junction in a semiconductor material, said junction having a peripheral portion thereof exposed on an outer surface of said semiconductor material whereby the area of said junction can be reduced by etching away said outer surface of said semiconductor material, (B) coupling a capacitance measuring device including a frequency discriminator across said junction to measure the capacitance thereacross, (C) placing said outer surface of said semiconductor material in contact with an etching fluid adapted to progressively etch away said outer surface of said semiconductor material, and (D) removing said semiconductor material from said etching fluid when said frequency discriminator produces an output indication.

3. The method defined in claim 2 and also including the step of (E) cleaning any residual etching fluid from said semiconductor material.

4. In the method of manufacturing a tunnel diode having a controllable characteristic maximum and minimum current value, the steps comprising (A) forming a tunnel diode junction in a semiconductor material, said junction having a peripheral portion thereof exposed on an outer surface of said semiconductor material whereby the area of said junction can be reduced by etching away said outer surface of said semiconductor material, said junction being adapted to produce a predetermined ratio between the characteristic maximum current and minimum current value for said tunnel diode, and the area of said junction being somewhat larger than the area required to produce a predetermined characteristic maximum current value for said tunnel diode, (B) coupling a capacitance measuring device across said junction to measure the capacitance thereacross, (C) placing said outer surface of said semiconductor material in contact with an etching fluid to progressively etch away a portion of said junction, (D) removing said semiconductor material from said etching fluid when the capacitance across said junction reaches a value corresponding to said predetermined characteristic maximum current value for said tunnel diode, and (E) cleaning any residual etching fluid from said semiconductor material.

5. In the manufacture of a semiconductor device,
 the method of fixing a desired current characteristic of said device including controllably etching a P-N junction of said device which comprises the steps of
 connecting said semiconductor into a capacitance measuring circuit so that a variation in the capacitance across said junction can be detected by an indicator in said circuit,
 placing said semiconductor in an etching fluid to progressively reduce the area of said junction to thereby alter said current characteristic, the value of said characteristic having a direct relation to the value of capacitance across said junction,
 removing said semiconductor from said etching fluid when said indicator registers an indication of the capacitance across said junction corresponding to said desired current characteristic,
 and rinsing said junction to remove residual etching fluid therefrom.

6. In the manufacture of a semiconductor device, the method of fixing a desired current characteristic of said device including controllably etching a P-N junction of said device which comprises the steps of
 connecting said semiconductor into a resonant circuit having an indicator therein for indicating a resonant condition,
 placing said semiconductor in an etching fluid to progressively reduce the area of said junction to thereby alter said current characteristic,
 applying radio frequency energy to said semiconductor and to said resonant circuit while said junction is being etched,
 removing said semiconductor from said etching fluid when said indicator senses a resonant condition indicative of said desired current characteristic,
 and rinsing said junction to remove residual etching fluid therefrom.

7. The invention described in claim 6 wherein said indicator senses resonance in a series resonant circuit.

8. The invention described in claim 6 wherein said indicator senses resonance in a parallel resonant circuit.

9. The invention described in claim 8 wherein said resonance is sensed by frequency discriminating means.

References Cited in the file of this patent

UNITED STATES PATENTS

| | | |
|---|---|---|
| 2,364,501 | Wolfskill | Dec. 5, 1944 |
| 2,411,298 | Shore | Nov. 19, 1946 |
| 2,588,702 | Cornelius | Mar. 11, 1952 |
| 3,023,153 | Kurshan | Feb. 27, 1962 |

FOREIGN PATENTS

| | | |
|---|---|---|
| 849,477 | Great Britain | Sept. 28, 1960 |

OTHER REFERENCES

IBM Technical Esaki Diodes, Etching Esaki Diodes, by Davis, vol. 3, No. 9, February 1961, pp. 26, 27.